United States Patent
Najafi-Yazdi

(10) Patent No.: US 11,625,060 B2
(45) Date of Patent: Apr. 11, 2023

(54) HYBRID PHOTONICS-SOLID STATE QUANTUM COMPUTER

(71) Applicant: ANYON SYSTEMS INC., Dorval (CA)

(72) Inventor: Alireza Najafi-Yazdi, Vaudreuil-Dorion (CA)

(73) Assignee: ANYON SYSTEMS INC., Dorval (CA)

( * ) Notice: Subject to any disclaimer, the term of this patent is extended or adjusted under 35 U.S.C. 154(b) by 0 days.

(21) Appl. No.: 17/706,791

(22) Filed: Mar. 29, 2022

(65) Prior Publication Data

US 2022/0221892 A1 Jul. 14, 2022

Related U.S. Application Data

(62) Division of application No. 17/499,925, filed on Oct. 13, 2021, now Pat. No. 11,460,877.

(Continued)

(51) Int. Cl.
*H04B 10/70* (2013.01)
*G06E 3/00* (2006.01)
(Continued)

(52) U.S. Cl.
CPC ............. *G06E 3/005* (2013.01); *G06N 10/00* (2019.01); *H01L 27/18* (2013.01); *H04J 14/02* (2013.01); *H04B 10/70* (2013.01)

(58) Field of Classification Search
CPC ........ H04B 10/70; H04B 10/25; H04B 10/50; H04B 10/40; H04B 10/43; G06E 3/005;
(Continued)

(56) References Cited

U.S. PATENT DOCUMENTS 6,897,434 B1 5/2005 Kumar et al.
7,127,168 B2 10/2006 Kani et al.
(Continued)

FOREIGN PATENT DOCUMENTS

WO 2018050948 3/2018
WO 2020088297 5/2020
WO 2020154745 7/2020

OTHER PUBLICATIONS

Lundberg et al., "Phase-coherent lightwave communications with frequency combs", Nature Communications, 2020, 7 pgs.
(Continued)

*Primary Examiner* — Hibret A Woldekidan
(74) *Attorney, Agent, or Firm* — Norton Rose Fulbright Canada LLP

(57) ABSTRACT

There is described herein a quantum computing system, quantum processor, and method of operating a quantum computing system. The quantum computing system comprises a quantum control system configured for at least one of delivery and receipt of multiplexed optical signals. At least one optical fiber is coupled to the quantum control system for carrying the multiplexed optical signals, and a quantum processor is disposed inside a cryogenics apparatus and coupled to the at least one optical fiber. The quantum processor comprises: at least one converter configured for converting between the multiplexed optical signals and microwave signals at different frequencies; and a plurality of solid-state quantum circuit elements coupled to the at least one converter and addressable by respective ones of the microwave signals at different frequencies.

15 Claims, 9 Drawing Sheets

Related U.S. Application Data

(60) Provisional application No. 63/225,963, filed on Jul. 27, 2021, provisional application No. 63/124,761, filed on Dec. 12, 2020.

(51) Int. Cl.
  *G06N 10/00* (2022.01)
  *H01L 27/18* (2006.01)
  *H04J 14/02* (2006.01)

(58) Field of Classification Search
  CPC ........ H01L 27/18; H04J 14/02; G02B 6/1225; G02B 6/12; G06N 10/00
  See application file for complete search history.

(56) References Cited

U.S. PATENT DOCUMENTS

| | | | |
|---|---|---|---|
| 7,636,522 | B2 | 12/2009 | Nagarajan et al. |
| 8,718,466 | B2 | 5/2014 | Meade et al. |
| 8,787,410 | B2 | 7/2014 | Fermann |
| 9,401,766 | B2 | 7/2016 | Yuan et al. |
| 9,454,061 | B1 | 10/2016 | Abdo et al. |
| 10,097,281 | B1 | 10/2018 | Vernik et al. |
| 10,379,420 | B1 | 8/2019 | Wang |
| 10,424,712 | B2 * | 9/2019 | Schoelkopf, III .. H01L 39/2406 |
| 11,201,686 | B1 | 12/2021 | Ritter et al. |
| 2014/0314419 | A1 | 10/2014 | Paik |
| 2015/0060756 | A1 * | 3/2015 | Park ...................... B81B 7/0093 257/9 |
| 2016/0267032 | A1 | 9/2016 | Rigetti et al. |
| 2017/0059962 | A1 * | 3/2017 | Hwang ................ G02B 6/2746 |
| 2018/0003753 | A1 | 1/2018 | Bishop et al. |
| 2020/0410343 | A1 | 12/2020 | Niu et al. |
| 2021/0272007 | A1 * | 9/2021 | Fatemi ................... G06N 10/40 |
| 2022/0146905 | A1 * | 5/2022 | Falk ...................... G02F 1/3501 |

OTHER PUBLICATIONS

De Cea et al., "Photonic Readout of Superconducting Nanowire Single Photon Counting Detectors", Nature Research, 2020, 8 pgs.

Forsch et al., Microwave-to-optics conversion using a mechanical oscillator in its quantum groundstate, Nature Physics, 2020, 11 pgs.

Lauk et al., "Perspectives on quantum transduction", Quantum Science and Technology, 2020, 16 pgs.

Lambert et al., "Coherent Conversion Between Microwave and Optical Photons—An Overview of Physical Implementations", Advanced Quantum Technologies, 2020, 15 pgs.

Youssefi, A. et al., Cryogenic electro-optic interconnect for superconducting devices, ArXiv: 2004.04705v2, Sep. 11, 2020, 10 pgs.

Lecocq, F. et al., Control and readout of a superconducting qubit using a photonic link, ArXiv: 2009.01167v1, Sep. 2, 2020, 13 pgs.

Delaney, R.D. et al., Non-destructive optical readout of a superconducting qubit, ArXiv: 2110.09539v1, Oct. 18, 2021, 20 pgs.

\* cited by examiner

HYBRID PHOTONICS-SOLID STATE QUANTUM COMPUTER

CROSS-REFERENCE TO RELATED APPLICATIONS

The present application is a divisional of U.S. patent application Ser. No. 17/499,925 filed on Oct. 13, 2021, which claims the benefit of U.S. Provisional Patent Application No. 63/124,761 filed on Dec. 12, 2020 and U.S. Provisional Patent Application No. 63/225,963 filed on Jul. 27, 2021, the contents of which are hereby incorporated by reference.

TECHNICAL FIELD

The present disclosure generally relates to the field of quantum computing. More specifically, the present disclosure relates to control and readout of solid-state qubits such as superconducting qubits, spin qubits, and topological qubits.

BACKGROUND OF THE ART

Solid-state qubits such as superconducting circuits, spin qubits and topological qubits based on semiconductor/superconductor nanowires are among leading architectures to build a quantum computer. Quantum control and readout of such qubits typically involve use of electronics and waves in microwave frequency (GHz) regimes.

To protect the qubits against thermal noise, these qubits are placed in cryogenics systems and operated in ultra-low temperatures, typically of the order of few millikelvins above absolute zero.

The qubits are controlled and measured by generating microwave pulses at room temperature and delivering the waves to the qubits in the cryostat via a set of microwave coaxial cables. When measuring the qubits, the input microwave pulses interact with the qubit circuit to produce an output microwave signal which is then transmitted to readout electronics by another coaxial cable. The coaxial cables are thermally anchored to different cooling stages of the cryogenics system. A quantum processor usually requires at least one control coaxial line per qubit for performing single-qubit gates on top of a number of readout coaxial lines. Additional coaxial lines can also be required to control couplers used to implement multi-qubit gates.

While existing techniques for controlling and measuring qubits are suitable for their purposes, improvements are desired.

SUMMARY

In accordance with a first broad aspect, there is provided a quantum computing system comprising a quantum control system configured for at least one of delivery and receipt of multiplexed optical signals. At least one optical fiber is coupled to the quantum control system for carrying the multiplexed optical signals, and a quantum processor is disposed inside a cryogenics apparatus and coupled to the at least one optical fiber. The quantum processor comprises: at least one converter configured for converting between the multiplexed optical signals and microwave signals at different frequencies; and a plurality of solid-state quantum circuit elements coupled to the at least one converter and addressable by respective ones of the microwave signals at different frequencies.

In accordance with another broad aspect, there is provided a quantum processor comprising at least one substrate, the at least one substrate having fabricated thereon solid-state quantum circuit elements, microwave circuit elements, and integrated photonic elements on a same one or different ones of the at least one substrate, the integrated photonic elements connectable to at least one optical fiber for data transmission.

In accordance with yet another broad aspect, there is provided a method for operating a quantum computing system. Uplink microwave signals at different frequencies are converted into uplink multiplexed optical signals. The uplink multiplexed optical signals are delivered, via at least one optical fiber, to a quantum processor comprising solid-state quantum circuit elements. The uplink multiplexed optical signals are reconverted, at the quantum processor, to the uplink microwave signals at different frequencies and the solid-state quantum circuit elements are addressed with the uplink microwave signals as reconverted, wherein the different frequencies are used to address different ones of the solid-state quantum circuit elements.

Features of the systems, devices, and methods described herein may be used in various combinations, in accordance with the embodiments described herein.

DETAILED DESCRIPTION

The present disclosure is directed to a scalable solid-state quantum computing platform where the quantum processor is operated at ultra-low temperatures and the need to use a significant number of coaxial cables is alleviated. The connection between the quantum processor and the quantum control system is achieved using optical fibers, and sending control or readout pulses to the solid state quantum processor operated at ultra-low temperatures uses a photonics approach.

Figure 1:
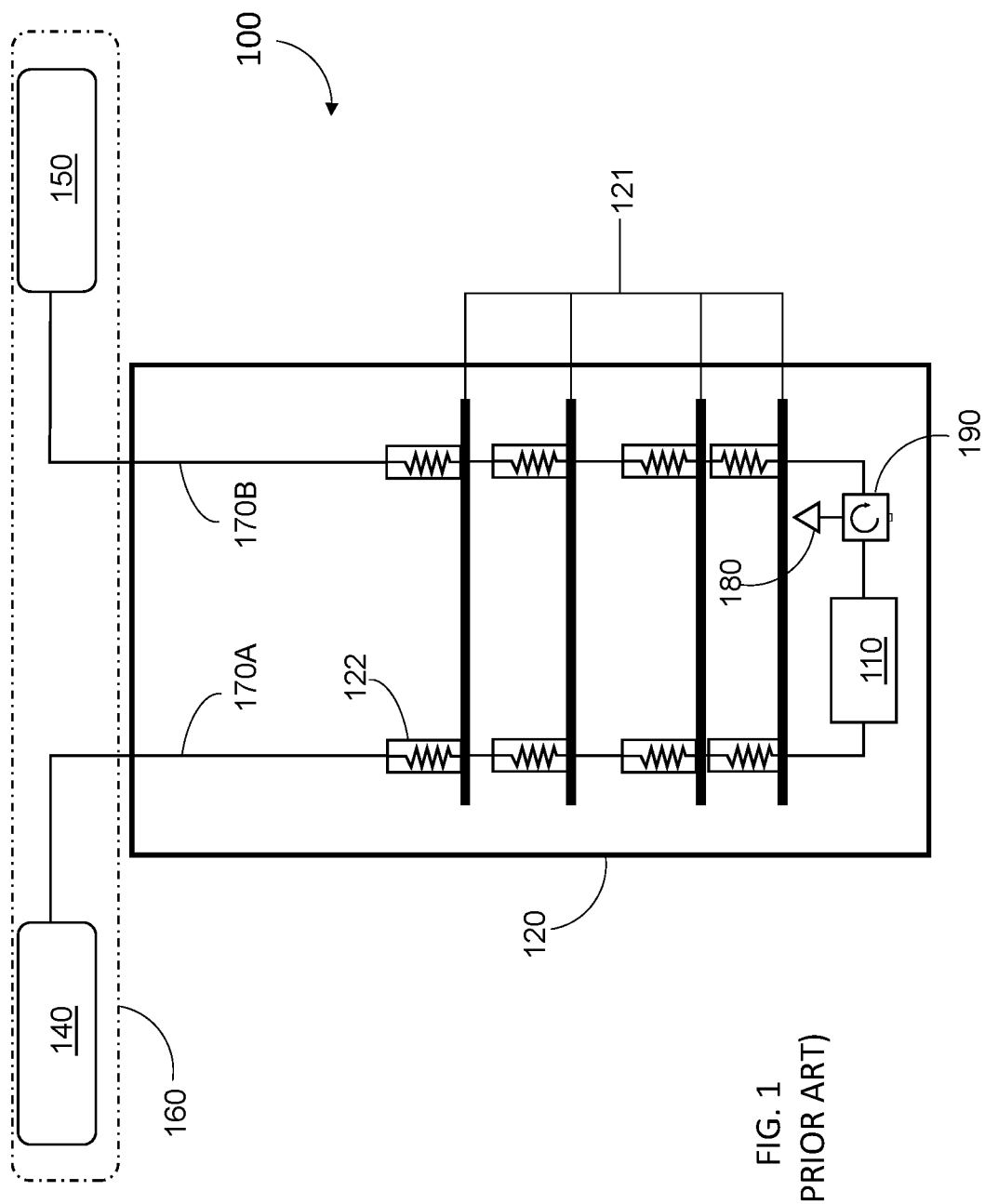
FIG. 1 shows a solid-state quantum computing system in accordance with the prior art.

FIG. 1 shows an example embodiment of a solid-state quantum computing system 100 in accordance with the prior art. The system 100 comprises a quantum processor 110 placed inside a cryogenics apparatus 120 such as a dilution fridge, and cooled down to ultra-low temperatures. Control and readout of the qubits in the quantum processor 110 is performed by a quantum control system 160. The quantum control system 160 may itself have separate modules for uplink and downlink. As used herein, any signal originating from the quantum control system 160 and delivered to the quantum processor 110, either for qubit control or readout, is referred to as "uplink" and any signal originating from the quantum processor 110 and delivered to the quantum control system 160 is referred to as "downlink". In FIG. 1, an uplink module 140 generates the necessary microwave pulses for qubit control and readout. The microwave pulses are transmitted to the quantum processor 110 via a set of coaxial lines 170A that are thermally anchored to cold stages 121 of the cryogenic apparatus 120 through a set of attenuators 122. Qubit states are measured through a set of coaxial lines 170B that leave the quantum processor 110 and connect to the downlink module 150 which is at room temperature and outside the cryogenics apparatus 120. The set of coaxial lines 170B are also thermally anchored to the cold stages 121 of the cryogenics apparatus 120 through the set of attenuators 122. This qubit readout chain may also involve one or more amplifiers 180 and/or circulators 190 to further improve the signal to noise ratio and protect the qubits from microwave feedback.

The quantum processor 110 requires at least one control coaxial line per qubit on top of a number of readout coaxial lines. Additional coaxial lines can also be required to control couplers used to implement multi-qubit gates. These coaxial lines are bulky, expensive, and also result in heat leak from the hotter stages of the cryogenics apparatus 120 to the colder areas. Noting that the cooling power of the cryogenics apparatus 120 decreases with temperature, installing more than a few hundred coaxial lines is challenging as the heat leak from the coaxial lines may exceed the cooling power of the cryogenics apparatus 120.

Moreover, practical applications of quantum computers typically require hundreds of thousands, and even millions, of qubits. Therefore, the solid-state quantum computing system 100 in accordance with the prior art is not scalable for large scale quantum processors. The present disclosure addresses these shortcomings by making use of optical fibers, which result in significantly lower heat load compared to coaxial cables. Optical fibers also provide large bandwidth which allows the use of multiplexing to address a large number of qubits with a single fiber.

Figure 2:
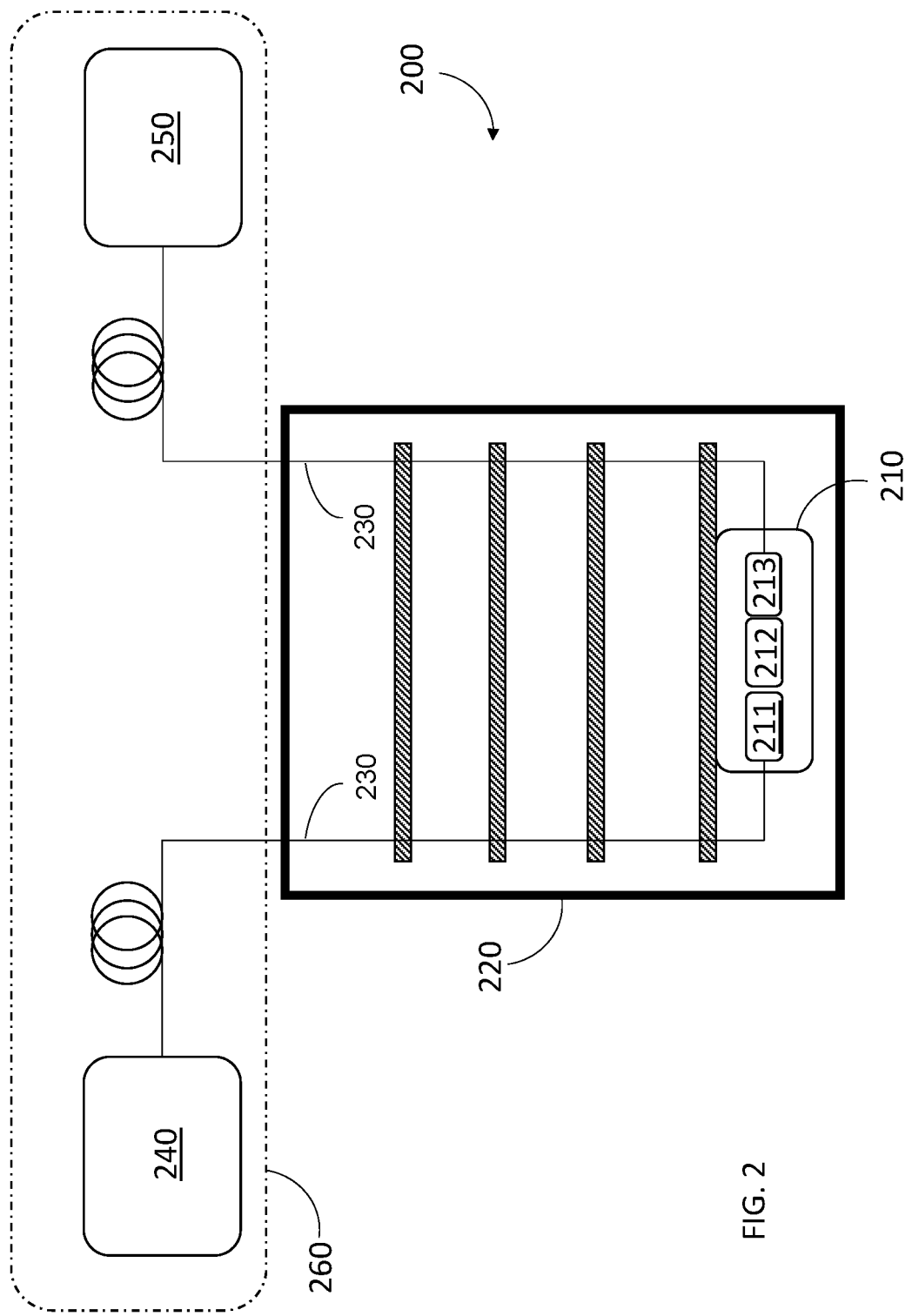
FIG. 2 shows an example embodiment of a system which uses a photonics-based system to control or measure an array of solid-state qubits.

FIG. 2 illustrates an example quantum computing system 200 in accordance with the present disclosure. The system 200 comprises a quantum processor 210 which is housed inside a cryogenics apparatus 220 such as a dilution fridge. The quantum processor 210 comprises one or more optical-to-microwave converters 211 which down-convert optical signals to microwave signals. The microwave signals are delivered to one or more quantum circuit elements 212 such as solid-state qubits and couplers operating in a sub-Tera Hertz frequency band. Microwave signals originating from quantum circuit elements 212 are up-converted to optical frequencies by one or more microwave-to-optical converters 213. The quantum processor 210 is connected to a quantum control system 260 through one or more fiber optic links 230. The quantum control system 260 may itself have separate subsystems for uplink, such as uplink module 240, and downlink, such as downlink module 250. In some embodiments, the quantum control system 260 comprises one integrated system for uplink and downlink. In some other embodiments, the quantum control system 260 comprises physically separate subsystems for uplink and downlink.

Optical-to-microwave converters 211 may for example consist of photodiodes, such as InGaAs photodiodes, or single-photon detectors. Microwave-to-optical converters 213 may for example consist of optical phase modulators, such as LiNbO$_3$-based electro-optical phase modulators, or other transducers based on optomechanics, piezo-optomechanics, electrooptics or magneto-optics.

In some embodiments, parts or all of the quantum control system 260 and/or its subsystems may reside inside the cryogenics apparatus 220.

Instead of pulse shaping microwave signals and delivering them to a quantum processor through coaxial cables, the quantum control system 260 modulates and demodulates optical signals that are delivered to or originate from the quantum processor 210 through optical fibers 230. The optical signals may have a wavelength in the short-wave infrared band, for which the transmission of optical fibers is maximal.

Figure 3:
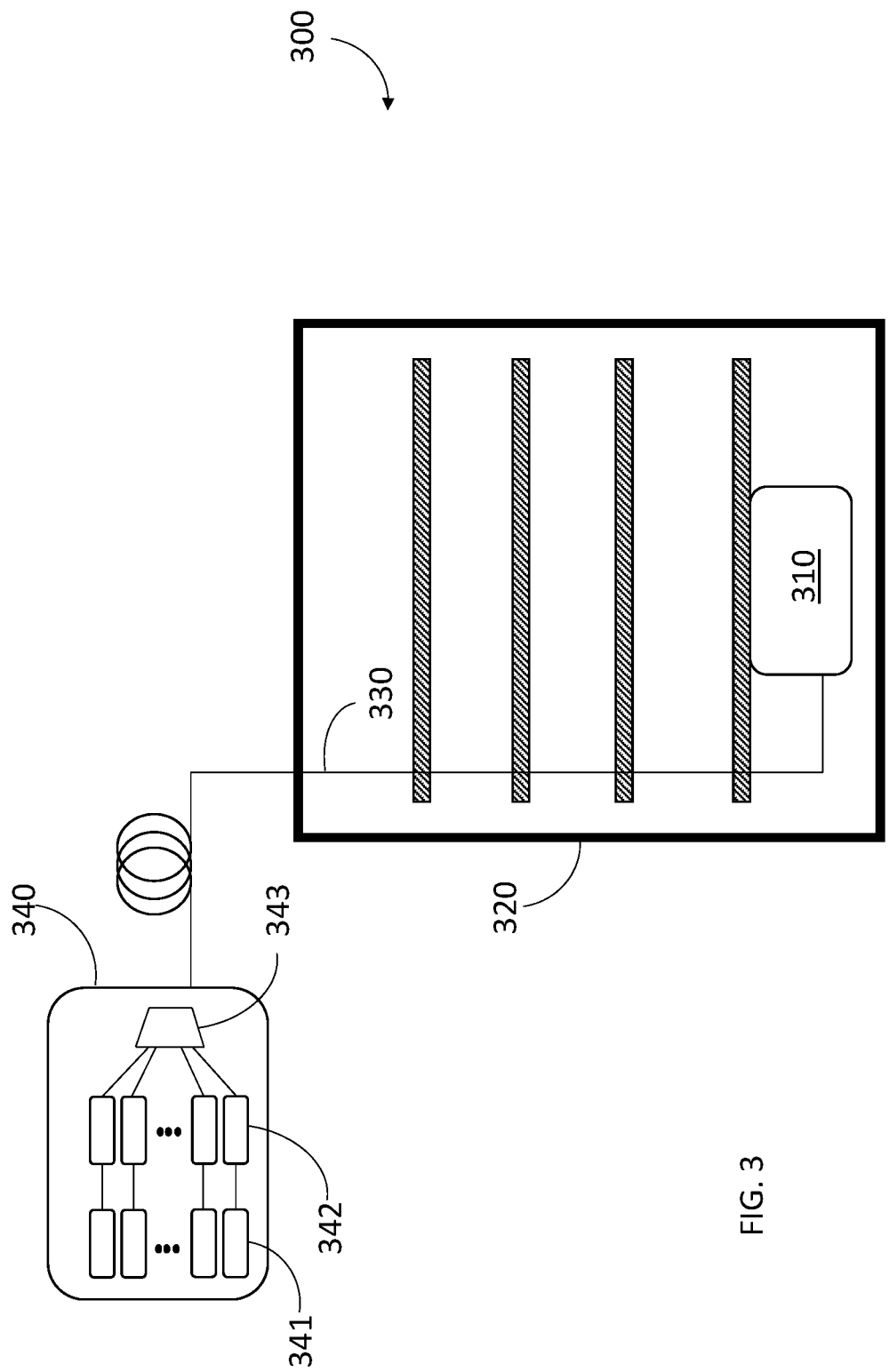
FIG. 3 shows an example embodiment of a system which uses multiplexing to control or measure an array of solid-state qubits using a single optical fiber link.

In some embodiments, one or more multiplexing schemes, such as Wavelength-Division Multiplexing (WDM), may be used to control and/or measure multiple qubits at the same time. FIG. 3 illustrates an example embodiment of the uplink side of a quantum computing system 300 implementing a multiplexing scheme. In this example, an uplink module 340 comprises an array of optical sources 341 followed by an array of modulators 342 before the optical signals are combined using a multiplexer into an optical fiber 330 and multiplexed optical signals are delivered to a quantum processor 310 located inside a cryogenics apparatus 320.

Figure 4:
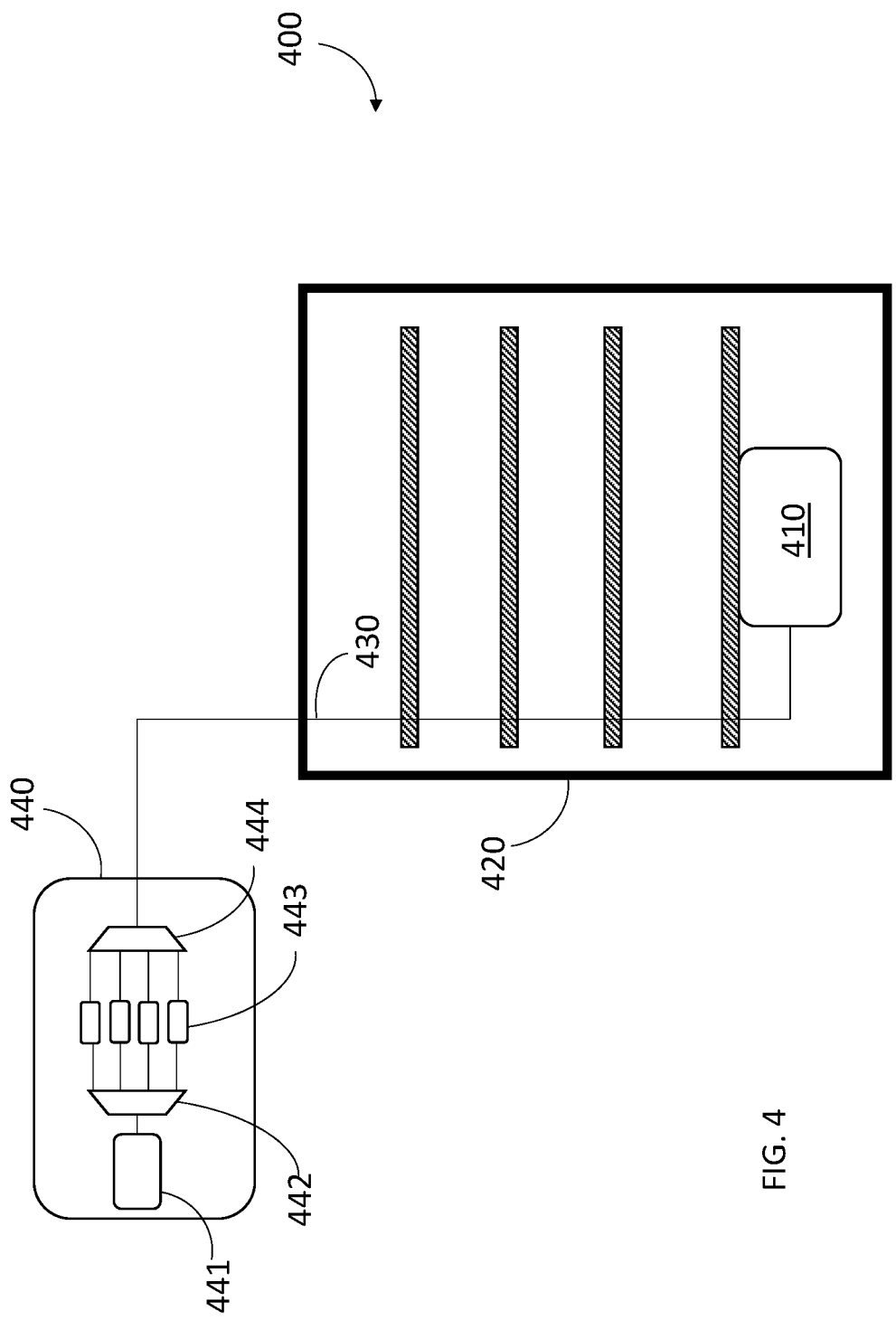
FIG. 4 shows an example embodiment of a system which uses modulation of optical frequency combs as a multiplexing method to control or measure an array of solid-state qubits using a single optical fiber link.

FIG. 4 illustrates another example of the uplink side of a quantum computing system 400 where an uplink module 440 uses a frequency comb source 441 rather than an array of optical sources. In one example implementation, the frequency comb source 441 may comprise a mode-locked laser which is self-referenced. In another example implementation, the frequency comb source 441 may rely on strong electro-optic phase modulation of a continuous laser to generate the frequency comb. In yet another example implementation, the frequency comb source 441 may comprise a light source such as a continuous laser connected to a nonlinear (Kerr) micro-resonator which creates a frequency comb through nonlinear mixing. In all of these examples, multiplexed optical signals are used to address multiple qubits, whereby signals of different frequencies are used to address different qubits.

In one implementation, the frequency comb generated by the source 441 may pass through a demultiplexer 442 which separates the comb lines and routes them to individual modulators 443 (e.g. a Mach-Zehnder modulator) for pulse shaping. Each frequency line in the frequency comb may be intended for preforming an operation on an individual quantum circuit element (e.g. a qubit or a coupler) located in a quantum processor 410. The individual modulators 443 are used to provide pulse shaping on individual frequencies according to the particular operation intended to be performed on a respective quantum circuit element in the quantum processor 410. The channels are then recombined by a multiplexer 444 before transmission over an optical fiber 430 to the quantum processor 410 located inside a cryogenics apparatus 420.

Figure 5:
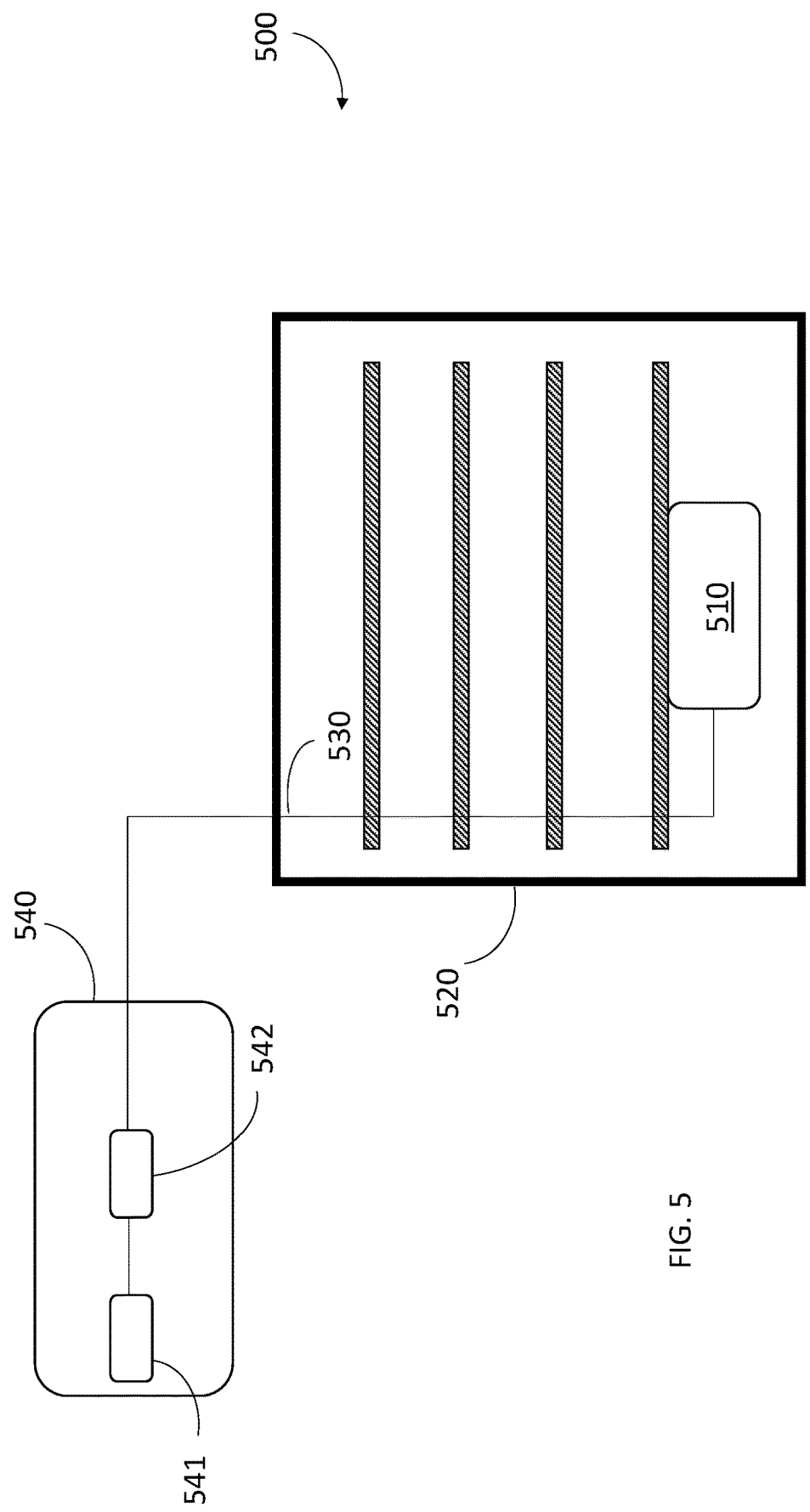
FIG. 5 shows an example embodiment of a system which uses an optical arbitrary wave generator to achieve multiplexing to control or measure an array of solid-state qubits using a single optical fiber link.

FIG. 5 illustrates another example embodiment of the uplink side of a quantum computing system 500 in which an uplink module 540 comprises a frequency comb source 541 and an optical arbitrary wave generator (OAWG) 542, such as a line-by-line pulse shaper, which translates quantum operations to waveforms. The multiplexed optical signal output by the generator 542 is delivered via an optical fiber 530 to a quantum processor 510 located inside a cryogenics apparatus 520.

Figure 6:
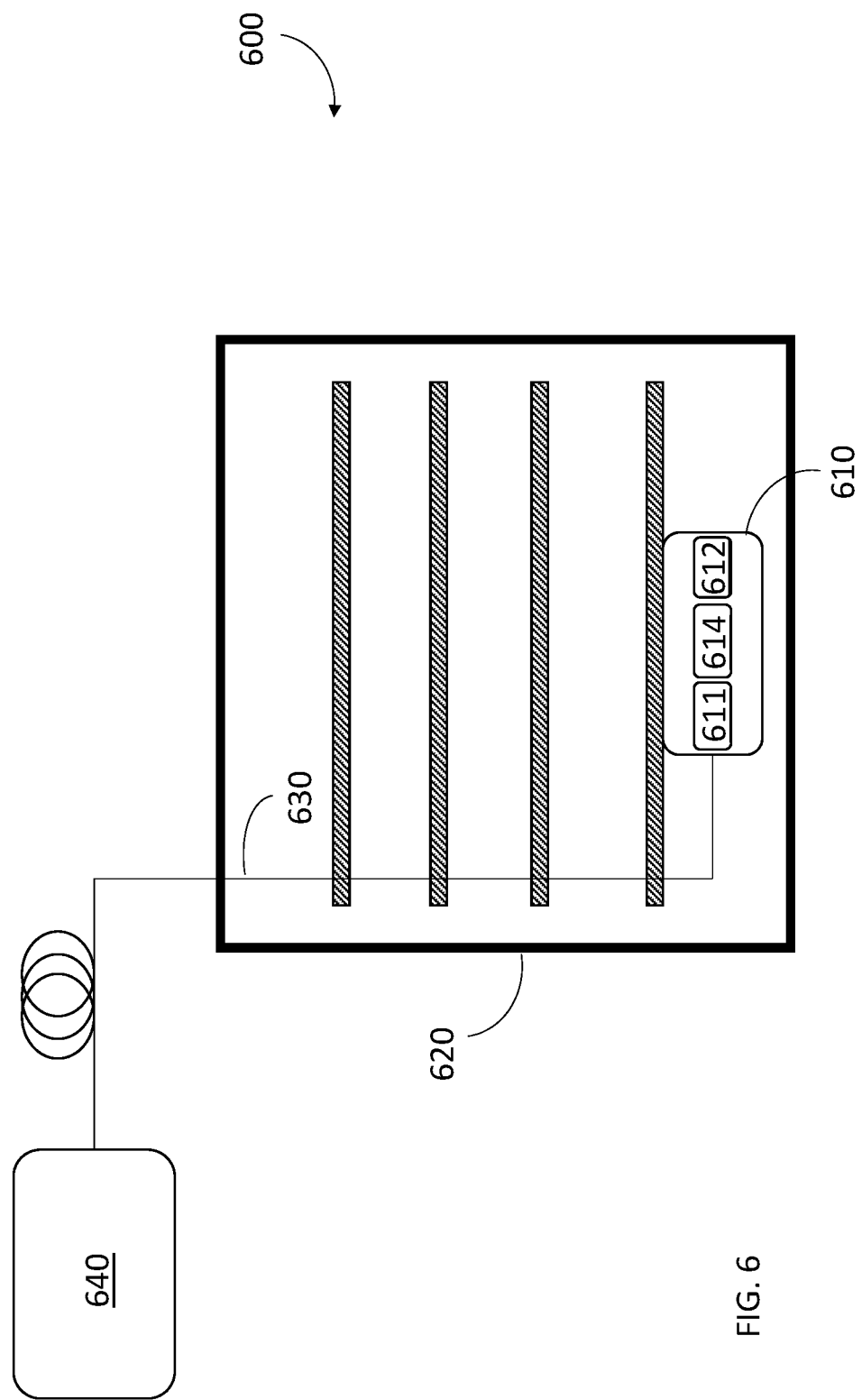
FIG. 6 shows an example of a system which uses an amplifier to amplify the input control or readout signal after it has been converted from optical frequencies to microwave frequencies.

FIG. 6 illustrates another example embodiment of the uplink side of a quantum computing system 600 which allows the use of a lower optical power in an uplink module 640 and optical fibers 630 to avoid excessive heating in a quantum processor 610 located inside a cryogenics apparatus 620. Since the passive heat load (i.e. due to heat propagating along the fiber) of optical fibers is negligible, what may limit the scalability of optically controlled quantum computers is the active heat load, i.e. heat due to the dissipation of the optical power at the exit of the optical fiber. The quantum processor 610 comprises a microwave amplifier 614 between an optical-to-microwave converter 611 and quantum circuit elements 612. In some embodiments, the microwave amplifier 614 can be a quantum-limited parametric amplifier, such as a Josephson Parametric Amplifier (JPA) or a Travelling-Wave Parametric Amplifier (TWPA), which are designed not to introduce any additional noise.

Figure 7:
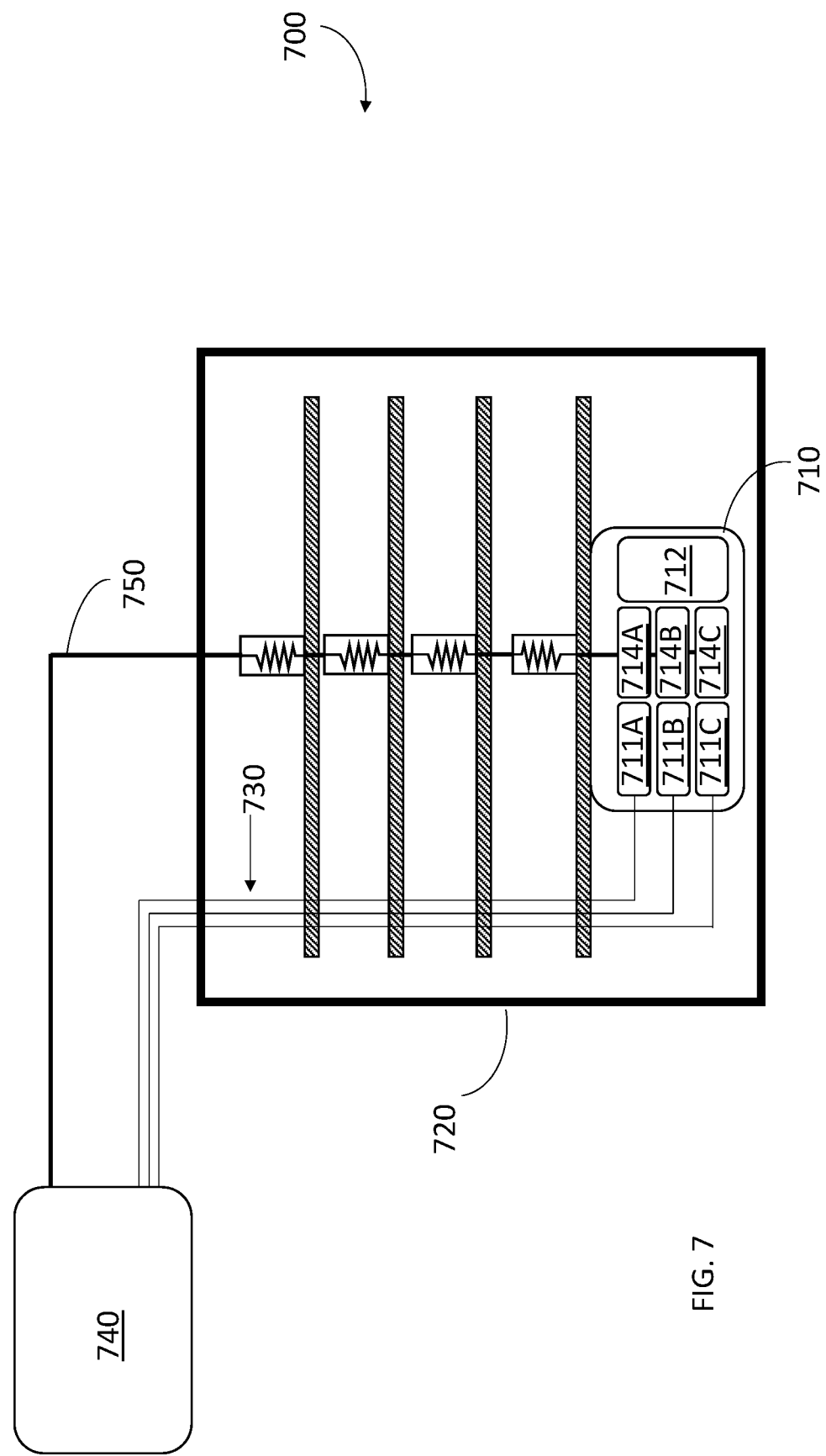
FIG. 7 shows an example of a system which uses a single coaxial cable to supply a microwave pump signal to an array of amplifiers.

FIG. 7 illustrates a system 700 having a plurality of optical fibers 730 and a plurality of optical-to-microwave converters 711A, 711B, 711C. The microwave signal generated by each optical-to-microwave converter 711A, 711B, 711C is amplified by a respective amplifier 714A, 714B, 714C before being directed to quantum circuit elements 712 of a quantum processor 710 located inside a cryogenic apparatus 720. To minimize the number of coaxial cables in the cryogenic apparatus 720, a single coaxial cable 750 can be used to supply a microwave pump signal to the amplifiers 714A, 714B, 714C. In FIG. 7, an uplink module 740 provides both control optical signals and the microwave pump signal, but these signals could also be provided by different and separate modules. Alternatively, with an all-optical quantum control system, the microwave pump signal could also be generated from an optical signal provided by optical fibers and down converted to microwave frequencies by an optical-to-microwave converter.

Figure 8:
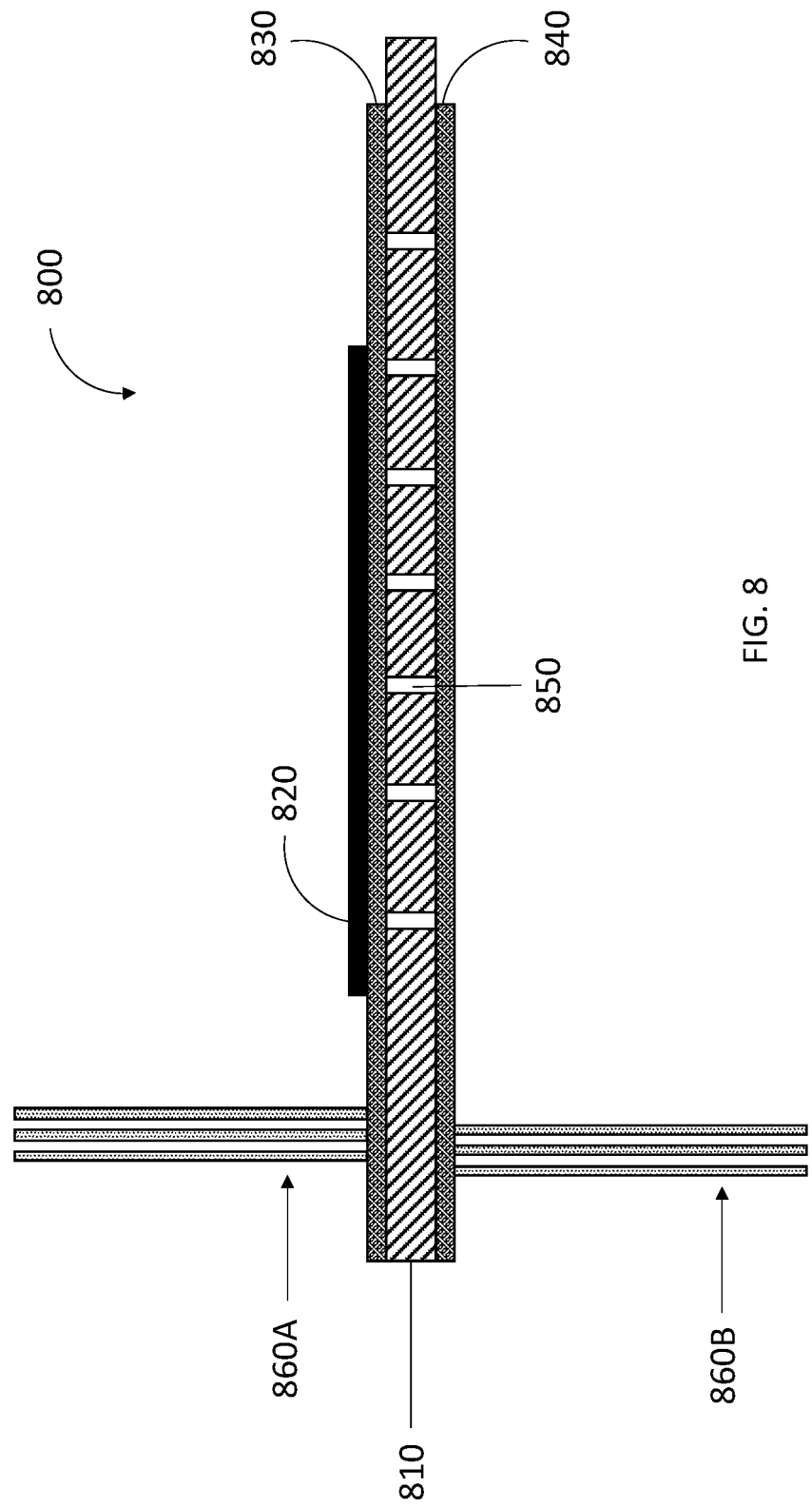
FIG. 8 shows an example of a quantum processor in which optical circuitry and qubits are integrated on the same substrate.

FIG. 8 depicts a quantum processor 800 according to one embodiment. The quantum processor 800 comprises at least one substrate 810. Solid-state quantum circuit elements, such as qubits and couplers, are fabricated on the substrate through a series of nanofabrication techniques such as lithography, deposition, etching, and lift off. In one example embodiment, these quantum circuit elements are fabricated on one side of the substrate as part of layer 820. The quantum processor 800 also comprises microwave circuit elements, such as readout resonators, microwave filters and transmission lines, which may also be fabricated on the substrate 810 through a series of nanofabrication techniques such as lithography, deposition, etching, and lift off. The microwave circuit elements may be fabricated on either side of the substrate 810 and/or as part of layer 820. The quantum processor 800 may also include another set of integrated photonic element such as waveguides, ring resonators, and optical-to-microwave converters. These photonics elements may be fabricated in layer 830, on the same side of the substrate as the quantum circuit elements, and/or on the opposite side of the substrate in layer 840. In the case where there are elements on both sides of the substrate, the electrical connection between both sides of the substrate may be achieved using vias 850. The integrated photonics circuitry may be connected to a single or an array of optical fibers 860A, 860B for data transmission.

Figure 9:
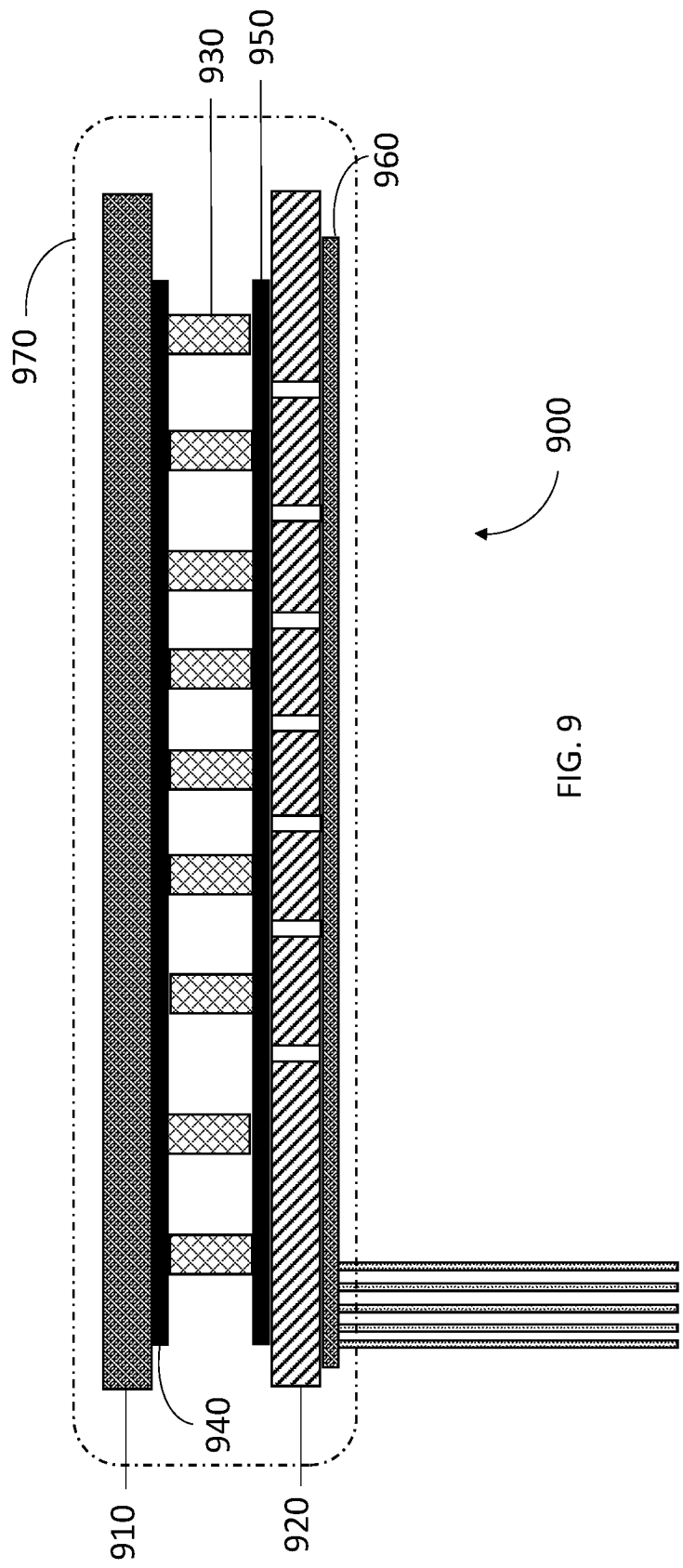
FIG. 9 shows an example of a multi-chip quantum processor in which qubits are fabricated on one substrate and optical circuitry is fabricated on a second substrate.

FIG. 9 depicts a quantum processor 900 according to another embodiment. The quantum processor comprises at least one multi-chip module (MCM) 970. In this arrangement, quantum circuit elements may be fabricated in layer 940 on a first substrate 910 while another substrate 920 carries another segment of circuitry and elements such as photonic elements in layer 960. Microwave circuit elements may reside on either substrate 910, 920, in layer 940 and/or layer 950. Elements fabricated on different substrates in layer 940 and layer 950 are electrically connected through a plurality of bond bumps 930, such as superconducting bond bumps. The multi-chip module 970 can also include additional substrates, for example a third substrate hosting one or a plurality of amplifiers (not shown). Amplifiers may also be fabricated on substrate 920, on either side thereof. It will be understood that other variants of 3D integration of such multi-chip quantum processors are possible, including but not limited to multi-chip vertical stack, flip-chip, and die on wafer arrangements.

The above description is meant to be exemplary only, and one skilled in the art will recognize that changes may be made to the embodiments described without departing from the scope of the disclosure. Still other modifications which fall within the scope of the present disclosure will be apparent to those skilled in the art, in light of a review of this disclosure.

Various aspects of described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. The scope of the following claims should not be limited by the embodiments set forth in the examples, but should be given the broadest reasonable interpretation consistent with the description as a whole.

The invention claimed is:

1. A quantum processor comprising at least one substrate, the at least one substrate having fabricated thereon solid-state quantum circuit elements forming qubits, microwave circuit elements, and integrated photonic elements on a same one or different ones of the at least one substrate, the integrated photonic elements connectable to at least one optical fiber for transmission of control or readout pulses for the qubits, wherein the at least one substrate has a first side and a second side opposite to the first side, the solid-state quantum circuit elements are on the first side, and the integrated photonic elements are on the second side of the at least one substrate.

2. The quantum processor of claim 1, wherein the solid-state quantum circuit elements, the microwave circuit elements, and the integrated photonic elements are fabricated on the same one of the at least one substrate.

3. The quantum processor of claim 1, wherein the microwave circuit elements comprise microwave amplifiers.

4. The quantum processor of claim 1, wherein the solid-state quantum circuit elements are superconducting qubits.

5. The quantum processor of claim 1, wherein the microwave circuit elements are on the second side of the at least one substrate.

6. The quantum processor of claim 1, wherein the microwave circuit elements are on the first side of the at least one substrate.

7. A quantum processor comprising at least one substrate, the at least one substrate having fabricated thereon solid-state quantum circuit elements forming qubits, microwave circuit elements, and integrated photonic elements on a same one or different ones of the at least one substrate, the integrated photonic elements connectable to at least one optical fiber for transmission of control or readout pulses for the qubits, wherein the at least one substrate comprises a plurality of substrates arranged in a multi-chip module, wherein the plurality of substrates comprises a first substrate having a first side and a second side and a second substrate having a third side and a fourth side, the first side of the first substrate facing the third side of the second substrate.

8. The quantum processor of claim 7, wherein the quantum state circuit elements are on a first layer on the first side of the first substrate.

9. The quantum processor of claim 8, wherein the integrated photonic elements are on a second layer on the fourth side of the second substrate.

10. The quantum processor of claim 8, wherein the integrated photonic elements are on a second layer on the third side of the second substrate.

11. The quantum processor of claim 8, wherein the microwave circuit elements are on a second layer on the third side of the second substrate.

12. The quantum processor of claim 8, wherein the microwave circuit elements are on the first layer on the first side of the first substrate.

13. The quantum processor of claim 7, wherein at least a first subset of the quantum circuit elements, the microwave circuit elements, and the integrated photonic elements are on the first side of the first substrate and at least a second subset of the quantum circuit elements, the microwave circuit elements, and the integrated photonic elements are on the third side of the second substrate.

14. The quantum processor of claim 13, wherein the first subset and the second subset are electrically connected through superconducting bond bumps.

15. The quantum processor of claim 7, wherein the quantum circuit elements, the microwave circuit elements, and the integrated photonic elements are on the first side of the first substrate, the third side of the second substrate, and the fourth side of the second substrate, wherein the first side and the third side are electrically connected through bond bumps, and wherein the third side and the fourth side are electrically connected through vias through the second substrate.

* * * * *